United States Patent [19]

Henig

[11] 4,292,676

[45] Sep. 29, 1981

[54] REFRESH CYCLE MINIMIZER IN A DYNAMIC SEMICONDUCTOR MEMORY

[75] Inventor: Sammy S. Henig, Clifton, N.J.

[73] Assignee: Lockheed Electronics Co., Inc., Plainfield, N.J.

[21] Appl. No.: 960,874

[22] Filed: Nov. 15, 1978

[51] Int. Cl.² .............................................. G11C 8/00
[52] U.S. Cl. .................................................... 365/222
[58] Field of Search ......................................... 365/222

[56] References Cited

U.S. PATENT DOCUMENTS

| | | | |
|---|---|---|---|
| 3,760,379 | 9/1973 | Nibby et al. | 365/222 |
| 3,810,129 | 5/1974 | Behman et al. | 365/222 |
| 3,858,184 | 12/1974 | De Vries | 365/222 |

OTHER PUBLICATIONS

Johnson, Self-Actuating Refresh Scheme for Dynamic Memories, IBM Tech. Disc. Bul., vol. 20, No. 11A, 4/78, pp. 4399-4400.

Primary Examiner—Stuart N. Hecker
Attorney, Agent, or Firm—Hopgood, Calimafde, Kalil, Blaustein & Lieberman

[57] ABSTRACT

A refresh circuit for a dynamic semiconductor memory wherein each access to the main semiconductor memory for the storage or retrieval of information is detected and recorded in an auxiliary memory. During each memory access, the memory row being accessed is automatically refreshed as part of the storage or retrieval process. In accordance with the invention, the auxiliary memory is examined prior to the commencement of a refresh cycle and if a particular row in the main memory has been accessed during the current refresh cycle, that row is not refreshed but is skipped until the next refresh cycle, at which time the need for a refresh signal is again determined.

5 Claims, 1 Drawing Figure

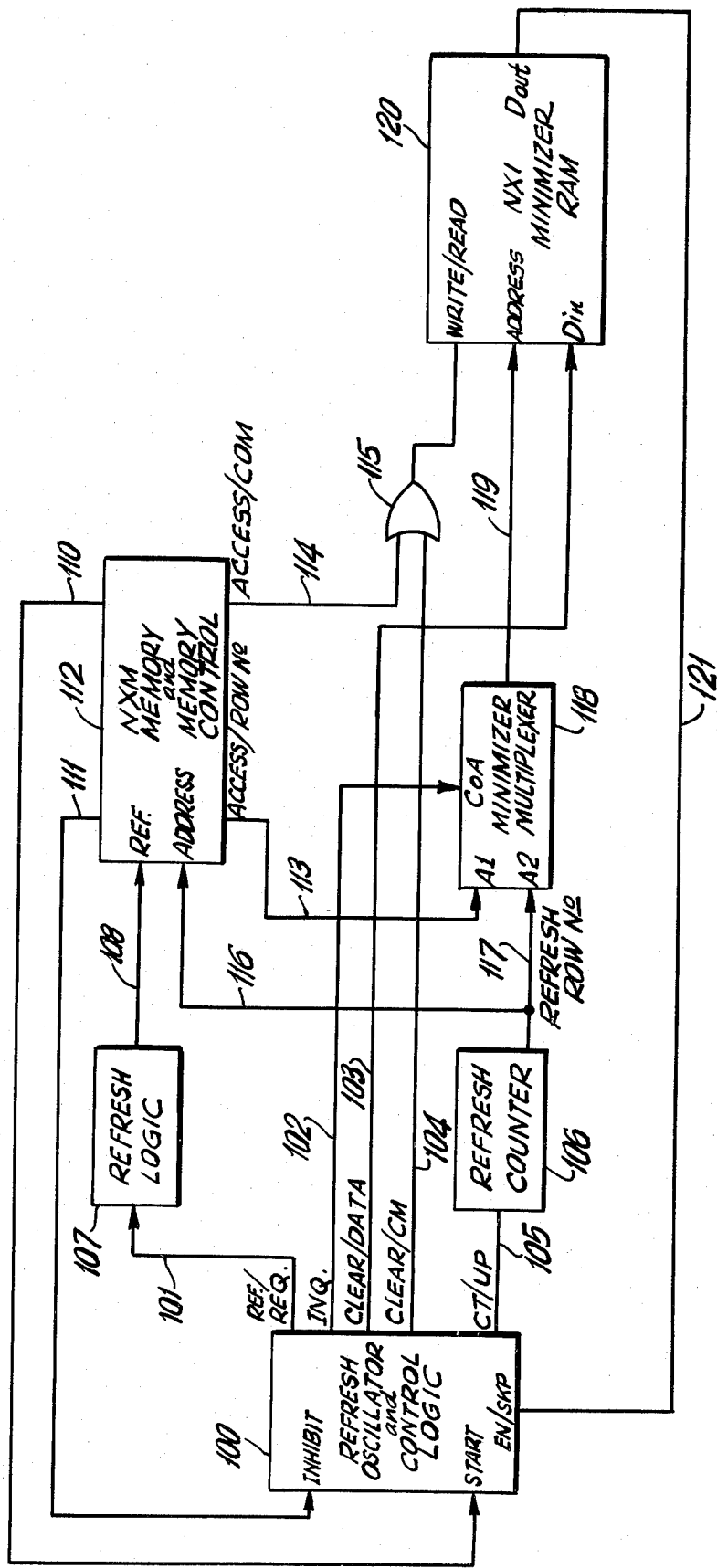

REFRESH CYCLE MINIMIZER IN A DYNAMIC SEMICONDUCTOR MEMORY

FIELD OF THE INVENTION

This invention relates to refresh circuitry for a dynamic semiconductor memory and more particularly, to a circuit for minimizing the number of refresh cycles required in dynamic semiconductor memories.

DESCRIPTION OF THE PRIOR ART

Dynamic semiconductor memories are currently in wide use due to their low cost and high storage capabilities. Such memories are constructed utilizing MOS technology and with this technology memory storage is achieved by storing a logic signal on a parasitic capacitance within a memory cell. The parasitic capacitance within the memory, used to store a logic signal, is subject to a certain amount of leakage current due to the manner in which the memory cell is constructed. Therefore, the signal level stored in the parasitic capacitance will gradually decrease over a period of time, and the signal stored therein will eventually be lost. Consequently, in dynamic semiconductor memories, it is necessary that the parasitic capacitance in the memory, utilized to store a signal, be periodically refreshed. Refreshing the memory simply consists of replacing the charge level stored on the parasitic capacitance such that the logic signal stored therein is returned to its initial storage level.

The discharge time for the parasitic capacitance utilized for storage in various memories will vary from memory to memory. However, in all dynamic semiconductor memories, this parasitic capacitance must be refreshed or recharged at predetermined periodic intervals. Typically, the refresh interval or cycle is approximately two milliseconds for the majority of memories now in commercial use. Therefore, when utilizing a dynamic semiconductor memory to store information, each storage location in the memory must be refreshed at intervals of approximately 2 milliseconds.

Storage locations in a semiconductor memory are arranged in rows and columns with a storage location located at each row-column intersection. Individual storage locations are refreshed by applying a refresh signal to each row in the memory which serves to refresh each storage location associated with that particular row. Prior art memory refresh circuits utilize a refresh oscillator and a refresh counter to accomplish the required periodic refresh cycles. More particularly, the refresh counter, which is incremented after every refresh cycle, identifies the particular row in the memory next requiring a refresh signal. The refresh oscillator, in response to row identification by the counter, enables associated logic circuitry which in turn applies a refresh signal to the row identified by the counter. The counter is then incremented by the refresh oscillator, to identify the next row requiring a refresh signal.

The digital information contained within a semiconductor memory is periodically stored in or retrieved from memory storage locations during access to the memory by associated control and address circuitry. During each memory access for the storage or retrieval of information, the memory row being accessed is automatically refreshed as part of the storage and retrieval process. Prior art memory refresh circuits do not make use of the fact that memory rows are refreshed each time the memory is accessed. Rather the prior art circuitry refreshes each row periodically, irrespective of the fact that the row may have been recently refreshed during access to the memory for the storage or retrieval of information. Therefore, in the prior art, the number of refresh cycles required in a dynamic semiconductor memory is constant and does not vary in response to the amount of memory use. It is of course apparent that a memory row can not be accessed for the storage or retrieval of information, while that row is being refreshed. Therefore, due to the fact that the number of refresh cycles required in prior art semiconductor memories is fixed, the available access time to the memory, for the storage and retrieval of information is reduced by the fixed time required for memory refresh.

It is therefore an object of this invention to decrease the number of refresh cycles required in a dynamic semiconductor memory.

It is another object of this invention to substantially improve the available access time in a dynamic semiconductor memory.

It is a further object of this invention to decrease the number of refresh cycles required in a dynamic semiconductor memory without greatly increasing the additional circuitry required to achieve the desired reduction in refresh time.

SUMMARY OF THE INVENTION

In accordane with the invention, an auxiliary memory is utilized to record each occurrence of main memory access for the storage or retrieval of information wherein each storage location in the auxiliary memory corresponds to a particular row in the main memory.

It is a feature of the invention that prior to commencing a refresh cycle, the auxiliary memory is examined to determine whether the particular row, to be refreshed, has been recently accessed during the normal storage or retrieval of information.

It is a further feature of the invention that if the row to be refreshed has been accessed, within the most recent refresh cycle, that row will be skipped and will not be refreshed until the next succeeding refresh cycle.

It is another feature of the invention that a control signal is stored in a particular storage location within the auxiliary memory each time the main memory is accessed, the control signal being deleted upon the completion of the current refresh cycle.

It is a further feature of the invention that the absence of a control signal in a storage location within the auxiliary memory indicates lack of main memory access during the most recent memory refresh cycle and memory refresh is commenced.

The foregoing and ther objects and features of this invention, will be more fully understood from the following description of an illustrative embodiment thereof taken in conjunction with the accompanying drawing.

BRIEF DESCRIPTION OF THE DRAWING

In the drawing:

The FIGURE illustrates a refresh minimizer circuit in accordance with the instant invention.

DETAILED DESCRIPTION

Refer to the FIGURE wherein there is illustrated a refresh cycle minimizer in accordance with the instant invention. Memory 112 is an NXM dynamic semiconductor memory having storage locations arranged in rows and columns and memory 112 requires the application of a refresh signal to each row in the memory at periodic intervals. In addition, as has been described above, each time memory 112 is normally accessed for the storage or retrieval of information, the particular row being accessed is refreshed by auxiliary memory control circuitry (not shown). Therefore, if memory access occurs within a preceding refresh period, it is not necessary to apply a refresh signal to that particular row during the same refresh cycle. It is of course understood that access to memory 112 is achieved with conventional addressing and control circuitry which is not illustrated in the FIGURE. In addition, the internal configuration of memory 112 and the memory control circuitry necessary to generate various well-known control signals is also not illustrated as a detailed description thereof is not required for purposes of describing the instant invention. More particularly, memory 112 includes an Inhibit output and a Start output. A logical "1" present at the Start output indicates that the memory is available for access and/or refresh while a logical "1" present at the Inhibit output indicates that the memory is currently in use and refresh and/or access must be delayed. Memory 112 also includes a Row Address output and an Access output. Each time the memory is accessed for the storage or retrieval of information, the address for the row being accessed is presented at the Row Address output and a control signal, indicating access, is presented at the Access output.

Refresh oscillator and control logic 100 and refresh counter 106 serve to identify a particular row in memory 112 requiring refreshing and also serve to initiate the refresh cycle, if necessary. Refresh counter 106 simply acts as a sequential pointer and supplies the address of the next row in memory 112 requiring a refresh signal. This counter is incremented each time a refresh cycle is completed and each time a refresh cycle is skipped as will be detailed hereinafter. Refresh counter and control logic 100, in conjunction with auxiliary memory 120, determines whether a refresh cycle will be commenced or skipped for a particular row in memory 112. This circuit also serves to increment the refresh counter. The detailed operation of this circuit will be described hereinafter.

Auxiliary Random Access Memory (RAM) 120 is an N×1 conventional random access memory containing a number of storage locations, equal in number to the number of rows in memory 112. The write/read input to the memory is utilized to control the storage of information in the memory and the retrieval of information from the memory. More particularly, when the write/read input is at a logic "0" level and an address is applied to the address input, the information stored in the location being addressed is read out from the memory and applied to the Dout terminal. Alternatively, when the write/read input is at a logical "1" level, and an address is applied to the address input, the data currently available at the Din input, is written into the memory at the location being addressed.

As described above, each time memory 112 is accessed for the storage or retrieval of information, an Access command is applied to lead 114 and the address of the row being accessed is applied to lead 113. The row address is applied via lead 113 to minimizer multiplexer 118. Multiplexer 118 is a conventional multiplexer utilized to apply two alternative addresses to the address input of auxiliary memory 120. More particularly, when a logical "0" level is applied to the control input of the multiplexer, the address present on the A1 input is applied via lead 119 to the address input of memory 120. Alternatively, when the control input is at a logical "1" level, the address present on input A2 is applied via lead 119 to the address input of memory 120. The control input to the multiplexer is normally at a logical "0" level as will be described hereinafter. Therefore, each time memory 112 is accessed, and the address of the row being accessed is applied to input A1, this address is applied to multiplexer 118 and from there, via lead 119, to the address input of memory 120. At the same time, the access command present on lead 114 is applied via gate 115 to the write/read input of memory 120. The access command is a logical "1", and therefore, the information present on the Din input of memory 120 is written into the location corresponding to the address which has been applied to the address input of memory 120. The Din input to memory 120 is normally at a logical "1" level as will be described hereinafter. Therefore, each time memory 112 is accessed, the access command, in conjunction with the address of the row being accessed, is applied to memory 120 and a logical "1" is written into the location in memory 120 corresponding to the address of the row being accessed. The result therefore, is that a logical "1" is stored in a particular location in memory 120, each time memory 112 is accessed, to indicate which row in memory 120 has been recently accessed.

The manner in which memory 112 is refreshed will now be explained in detail. Refresh oscillator and control logic 100 includes a free running oscillator having a period equal to ½ the interval T at which memory 112 would be refreshed (lacking the inventive minimizer apparatus) divided by the number of memory rows. A logical "1" is generated by the refresh oscillator and applied to the Inq output at periodic intervals corresponding to the intervals at which memory 112 must be refreshed without cycle minimization. Oscillator and control logic 100 includes an Inhibit and a Start input as shown in the FIGURE. When the inhibit input is high, it indicates that memory 112 is currently being accessed and thus, cannot be refreshed. Alternatively, when the Start input is at a logical "1" level, it indicates that memory 112 is not being accessed, or that an access cycle has just been completed and therefore, the memory can be refreshed. Assume now that a logical "1" is applied to the Start input of the refresh oscillator, and the Inq output on lead 102 is at a logical "1" indicating commencement of a refresh inquiry. At this time, a logical "1" applied to the control input of multiplexer 118 serves to apply the address from the refresh counter to memory 120 via multiplexer 118 and lead 119. As described above, refresh counter 106 maintains the address of the row in memory 112 which is to be refreshed next. Therefore, this address, when applied to memory 120, accesses the storage location in memory 120 corresponding to the row in memory 112 which is to be refreshed next. At this time, the Clear/CM output of oscillator and control logic 100 is at a logical "0" level, and therefore, the write/read input to memory 120 is also at a logical "0" level. Therefore, the application of the next row address to memory 120 serves to read out the information stored in that particular location and that information is applied to the Dout output, to lead 121, and from there to the EN/SKP input of oscillator and control logic 100.

If the information stored in the particular location in memory 120 is equal to a logical "1", it indicates that the particular row being addressed was accessed during the preceding refresh period. In this instance, it is not necessary to refresh that particular row and the refresh cycle will be skipped. In response to the application of a logical "1" to the EN/SKP input of oscillator and control logic 100, the Clear/CM output goes high, applying a logical "1" to the write/read input of memory 120 and the Clear/Data output of oscillator and control logic 100 goes low applying a logical "0" to the Din input of memory 120. Recall that the current address being applied to memory 120 is the address of the row which was recently accessed and a logical "1" was stored in the corresponding location in memory 120. The combination of logical "1" present at the write/read input and the logical "0" at the Din input serves to delete the logical "1" stored in memory 120 at the location corresponding to that row which was recently accessed. Therefore, during the next refresh period, if that particular row is not accessed, a logical "0" will be present in that particular location indicating the necessity for a refresh cycle. It is clear that since this process just described, occurs each refresh inquiry cycle, the presence of a logical "1" in any location in memory 120 indicates access to main memory 112 during the preceding refresh period, and then a refresh signal is not required. Alternatively, the presence of a logical "0" indicates no access and a refresh signal is required. The refresh counter is also incremented at this time by a logical "1" applied to the CT/UP output of oscillator and control logic 100 which is in turn applied to the refresh counter via lead 105 to move the refresh counter to the next memory address to be refreshed. Incrementing the refresh counter occurs subsequent to the storing of the logical "0".

Assume now that oscillator and control logic 100 signifies the commencement of a refresh inquiry cycle, auxiliary memory 120 is examined, in the manner described above, and the particular storage location in memory 120, corresponding to the row to be refreshed, contains a logical "0". As described above, this indicates that this row has not been accessed during the preceding refresh period and thus, must be refreshed at this time. The logical "0" output is applied to the EN/SKP input of oscillator and control logic 100. In response thereto, the circuit 100 applies a logical "1" to the Ref/Req output which is in turn applied via lead 101 to refresh logic 107. Refresh logic 107 is simply standard circuitry utilized to refresh a particular row in memory 112. The refresh logic, in response to this logical "1" signal, refreshes the row in main memory 112 currently being identified by counter 106, and identification being accomplished by the application of the next row address to be addressed to the address input of memory 112 via lead 110. Subsequent thereto, counter 106 is incremented by oscillator and control logic 100, in the manner described above and the complete procedure is repeated.

The procedure just described continues to refresh memory 112 during each refresh cycle if in fact the particular row being addressed was not refreshed during the preceding refresh period. As described, auxiliary memory 120 determines, for the refresh circuitry, whether the memory row being addressed was in fact accessed during the preceding refresh period, and if it was, the refresh cycle is skipped. In summary, therefore, the instant invention serves to minimize the number of refresh cycles required in a dynamic semiconductor memory. This minimization is achieved by storing each occurrence of access to the main memory in the auxiliary memory in a particular storage location corresponding to the main memory row just accessed. This stored information is then utilized by the refresh counter and refresh oscillator to determine whether the particular row being addressed should be refreshed during the current refresh cycle or alternatively, whether the refresh cycle can be skipped and applied during the next refresh cycle.

Although a specific embodiment of this invention has been shown and described, it will be understood that the various modifications may be made without departing from the spirit of this invention.

I claim:

1. A refresh circuit for an N×M dynamic semiconductor memory comprising:
   means for identifying rows in the N×M memory requiring the application of a refresh signal thereto,
   means for periodically applying refresh signals to the N×M memory rows identified by the identifying means,
   an N×1 auxiliary memory, having N storage locations, the number of storage locations corresponding to the number of rows in the N×M memory,
   means for detecting access, for the storage and retrieval of information, to a predetermined N×M memory row,
   means responsive to the detecting means for storing a control bit in the N×1 memory at a storage location corresponding to the predetermined row in the N×M memory, and
   means responsive to the presence of a control bit in said N×1 memory storage location for preventing the applying means from applying a refresh signal to the predetermined row.

2. A refresh circuit in accordance with claim 1, further including means responsive to the absence of a control bit in said N×1 memory storage location for allowing the applying means to apply a refresh signal to the N×M memory row corresponding to said N×1 memory storage location.

3. A refresh circuit in accordance with claim 2, wherein there is further included means responsive to the operation of the preventing means for deleting the control bit stored in the N×1 memory storage location.

4. A refresh circuit in accordance with claim 3, wherein the identifying means includes a binary counter, said binary counter being incremented in response to each operation of the preventing means and the allowing means.

5. A refresh circuit in accordance with claim 4, wherein there is further included means responsive to N×M memory access for disabling operation of the applying means while N×M memory access is occurring.

* * * * *